(12) United States Patent
Nölscher (10) Patent No.: US 7,361,434 B2
(45) Date of Patent: Apr. 22, 2008

(54) PHASE SHIFT MASK

(75) Inventor: Christoph Nölscher, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 582 days.

(21) Appl. No.: 10/951,805

(22) Filed: Sep. 29, 2004

(65) Prior Publication Data

US 2005/0084771 A1    Apr. 21, 2005

(30) Foreign Application Priority Data

Sep. 30, 2003 (DE) ............................... 103 45 477
Dec. 19, 2003 (DE) ............................... 103 59 991

(51) Int. Cl.
*G03F 1/00* (2006.01)
(52) U.S. Cl. ........................................................ 430/5
(58) Field of Classification Search .................... 430/5, 430/394; 716/19–21
See application file for complete search history.

(56) References Cited

U.S. PATENT DOCUMENTS 5,565,286 A    10/1996  Lin
6,593,039 B1 *  7/2003  Kim ................................. 430/5
6,902,852 B2 *  6/2005  Watanabe ....................... 430/5
2003/0064300 A1  4/2003  Watanabe
2004/0121244 A1  6/2004  Misaka

* cited by examiner

*Primary Examiner*—S. Rosasco
(74) *Attorney, Agent, or Firm*—Edell, Shapiro & Finnan, LLC (57) ABSTRACT

Semitransparent and trenchlike, absorber-free structure elements are formed jointly on a photomask formed using phase mask technology. The trenchlike structure elements are formed as trench or mesa structure using CPL technology. In a layout, dense, but also if appropriate semi-isolated and isolated, but relatively thin pattern portions are selected to fabricate them on the photomask using CPL technology. By contrast, isolated, wider pattern portions are formed as semitransparent structure elements using halftone phase mask technology. The respective process windows are relatively large and are adapted to one another. The joint process window is enlarged. In the area of dynamic memory chips, structures in a memory cell array can be formed using CPL technology and the support regions using halftone phase mask technology. In logic circuits, thin conductor tracks using CPL technology and wider conductor tracks using halftone phase mask technology can be fabricated.

14 Claims, 6 Drawing Sheets

PHASE SHIFT MASK

CROSS REFERENCE TO RELATED APPLICATIONS

This application claims priority under 35 USC § 119 to German Application No. DE 10345477.2, filed on Sep. 30, 2003, and titled "Phase Shift Mask," and from German Application No. DE 10359991.6, filed on Dec. 19, 2003, and titled "Phase Shift Mask," the entire contents of each are hereby incorporated by reference.

FIELD OF THE INVENTION

The invention relates to a phase shift mask for the projection of a pattern of structure elements formed on the mask onto a substrate, and to a method for fabricating the pattern on the mask.

BACKGROUND

Integrated circuits are fabricated by the photolithographic projection of patterns formed on photomasks onto semiconductor wafers. In this case, a mask with the pattern corresponding to the circuit plane is generally used for each plane.

Large scale integrated circuits such as, for example, dynamic or nonvolatile memories and also logic chips are currently being fabricated with circuit elements whose width reaches down to 70 nm. In the example of the memory chips, this applies, for example, to the very densely and periodically arranged patterns of narrow word or bit lines and, if appropriate, the corresponding contact connections or memory trenches.

In this case, it can often happen that the corresponding large scale integrated structure patterns are arranged in a circuit plane jointly with the peripheral region that electrically connects the structure elements. Structure elements, for example, conductor tracks, of such peripheral regions are usually subject to relaxed requirements made of the structure width. Accordingly, dense, often periodic arrangements of structure elements and isolated or semi-isolated structure elements having larger dimensions are jointly arranged together in one pattern on the photomask to be used for the formation of the circuit plane.

It is known that during the lithographic projection, structure elements whose width is in the vicinity of the resolution limit of the respective exposure device are transferred into the image plane differently than nonperiodic structure elements having larger dimensions, due to optical imaging properties. This is due to the limited numerical aperture of the exposure device and to the individual exposure settings in the device. Given the presence of lens aberrations, for example, due to lens defects, the various imaging effects may be intensified and become visible in particular as line width variations or positional accuracy errors in the structure pattern portions.

Figure 1:
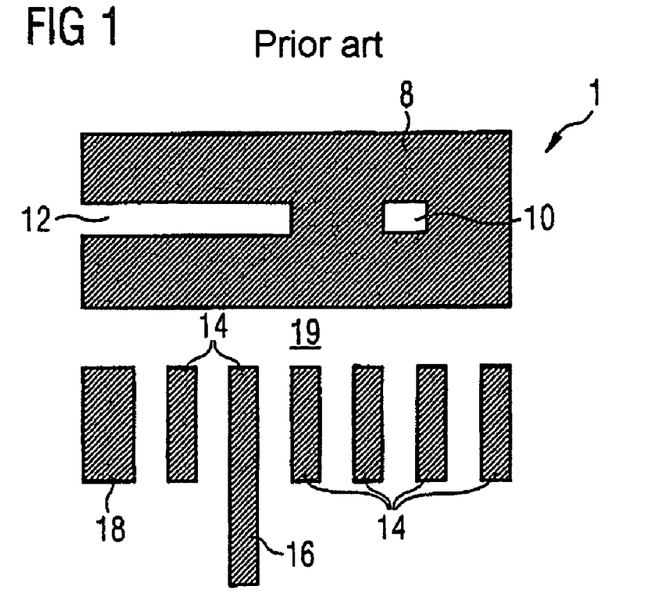
FIG. 1 shows a pattern of structure elements to be formed on a wafer.

FIG. 1 shows a simplified illustration of a detail from a circuit layout or a pattern 1 to be formed on a semiconductor wafer, which has both structure elements 14 arranged densely and periodically and structure elements 10, 12, 16 arranged in isolated or semi-isolated fashion. Areas depicted dark in the illustration represent elevated structure elements on the wafer, i.e. non-etched areas.

The structure element 10 corresponds, for example, to a contact hole that may be fabricated by irradiation of a corresponding opening on the mask into a photosensitive layer on the wafer (positive resist), a subsequent development and transfer into an underlying layer in an etching step.

Figure 2:
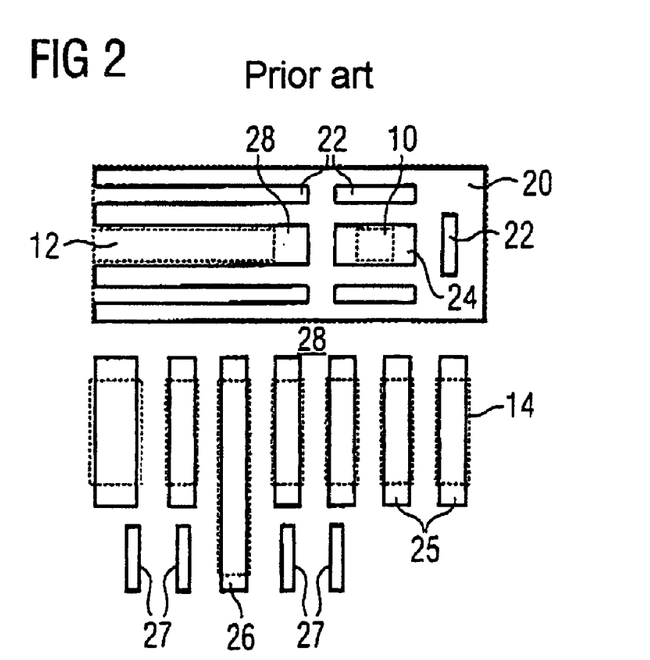
FIG. 2 shows a pattern on a photomask, which pattern is to be used for forming the pattern on the wafer as shown in FIG. 1, using halftone phase mask technology (prior art)

FIG. 2 shows a solution approach for the above-mentioned problem of simultaneously imaging dense, periodic structure elements and isolated or semi-isolated structure elements. The solution approach is based on using halftone phase masks. The light-shading structure elements for forming the resist areas that are still unexposed on the wafer (areas depicted dark in FIG. 1) are not made opaque, but rather semitransparent on the mask. The light transmissivity is, for example, 6% transmission at a wavelength of 193 nm using oblique illumination.

The semitransparent structure elements 25, 26 are present both in a dense and periodic arrangement and in the form of isolated lines. On the mask relative to the wafer scale, the semitransparent structure elements have a longer length compared with the structure elements 14 to be formed on the wafer for compensating the line shortening effect. The isolated line 26 and the bright structures 28, 24 are assisted by so-called SRAF structures (subresolution assist features) 22, 27, which do not print onto the wafer, i.e., arise as actual resist structures on the wafer due to their width lying below the resolution limit of the exposure device.

For forming a mask bias, the structure elements 28, 24 embodied as gaps in the semitransparent region 20 are analogously made larger than the isolated or semi-isolated structure elements 10, 12 to be formed on the wafer, which is shown in the figures by the weakly dashed lines.

The use of the SRAF structures 22, 27 brings about an imaging of the isolated or semi-isolated structure elements as if these were situated in a dense environment of further structure elements. This reduces the difference between dense arrays and isolated structures during the optical projection. However, using halftone phase masks, the mask error enhancement factor (MEF) assumes particularly large values precisely, for example, in the cell array of memories having 70 nm width structure elements including lines and gaps. This factor represents the effect that, in the case of structures near the resolution limit, errors on the mask are transferred non-linearly into correspondingly formed widths on the wafer. The CD tolerance budget (CD: critical dimension) that is still available is generally exhausted early.

A further solution approach is to use transparent and phase-shifting structure elements in the region of the dense, highly integrated pattern portions. Oblique illumination is preferably to be set in this case. The structure formation on a wafer is effected based on the destructive interference at the image position of the phase edges of the phase-shifting structure elements with respect to the transparent, non-phase-shifting surface surrounding the structure element in each case. This procedure is also referred to as CPL technology (chromeless phase edge lithography). In this case, the structure elements are made so narrow that two adjacent phase edges lead to a line formation in the resist of a wafer. The lines are superimposed in their edges and thus merge to form a common line. Wider lines are formed with an opaque absorber, for example, chrome.

Figure 3:
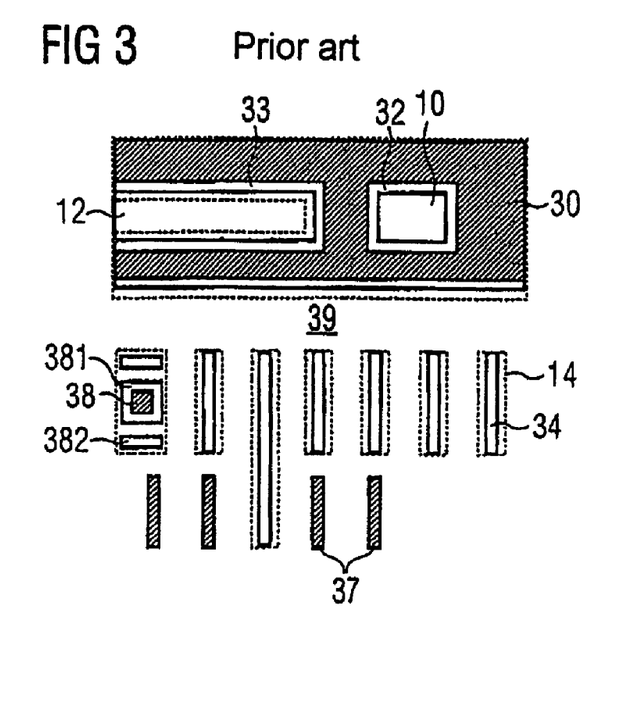
FIG. 3 shows a pattern on a photomask as in FIG. 2, but using CPL and RIM phase mask technology (prior art)

One example can be seen in FIG. 3, in which dense, periodic arrangements of structure elements 34 are etched into the surface 39 of a mask substrate as fully transparent, phase-shifting areas. The etching depth into the substrate, for example, quartz, is chosen to achieve a phase shift of 180° with respect to incident light in comparison with the surrounding surface of the mask substrate 39. SRAF structures 37 made from absorber or semitransparent halftone material may likewise be provided in order to improve the imaging behavior of semi-isolated lines. Wider lines may be enabled from a combination of absorbing structure elements 38 and of phase-shifting structure elements 381, 382. The imaging behavior of bright regions serving for the formation of the structure elements 10, 12 in the opaque environment 30 may be improved by RIM structure elements 32, 33, which yield a steeper intensity profile at the edges of the respective structure elements.

With this solution, that the process window for the regions embodied in chrome or other absorber materials is smaller than that for the comparable semitransparent regions of a halftone phase mask in accordance with FIG. 2. Furthermore, the above-mentioned RIM structure elements can be fabricated with the required accuracy only with very great difficulty. Further, due to the very narrow fully transparent, phase-shifting structure elements in the dense array of lines and gaps, a close-meshed coordinate grid is required for the mask writing and the volume of data for the mask writing process and also the mask inspection is therefore increased excessively. Finally, attention should also be drawn to an increased susceptibility to errors in the production, the measurement and in the error detection in the structure element arrangements.

Figure 4:
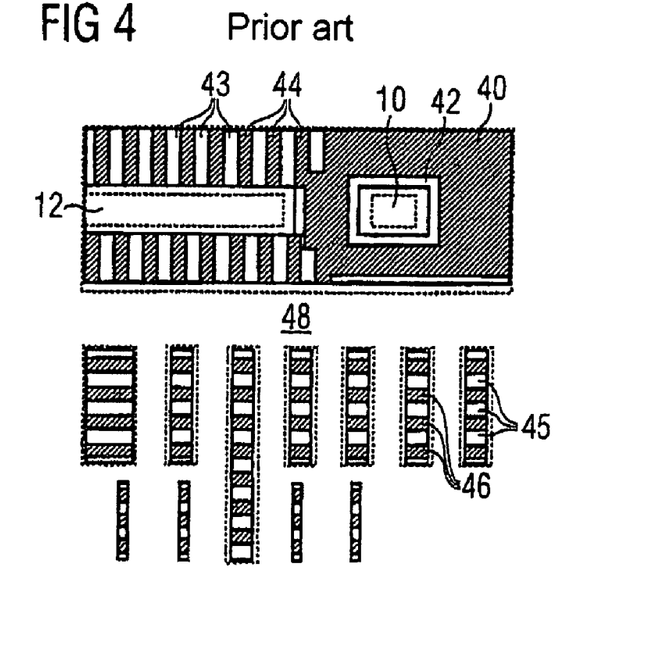
FIG. 4 shows a modification of FIG. 3 in accordance with the prior art with a strip-type arrangement of CPL structures and chrome strips (prior art)

An improvement of the solution approach shown in FIG. 3 is shown in the striplike structure pattern of FIG. 4. By alternate arrangements of chrome strips 43, 46 and fully transparent, phase-shifting structure elements 44, 45, the requirements made of the resolution during the mask writing process may be relaxed somewhat, while a high degree of dimensional accuracy is achieved for the structure elements to be formed on the wafer. However, the abovementioned disadvantages with regard to the problems of fabricating RIM structures, the reduced process window for the chrome regions and also the susceptibility to errors remain here, too.

Enlarging the process window for the imaging of a pattern from a mask onto a semiconductor wafer with very different degrees of periodicity and/or integrity is desirable. Furthermore, fabrication of structures in large scale integrated circuits with a width is smaller than previously possible with mask techniques used hereto, is desirable. Fabrication of masks with improved quality is desirable.

SUMMARY

A phase mask for the projection of a pattern of structure elements formed on the mask onto a substrate, i.e., a semiconductor wafer, can include a first portion of the pattern, and a second portion of the pattern. First structure elements are formed as elevated ridges made from a semitransparent, phase-shifting material, which is arranged on a planar surface of a transparent mask substrate of the phase shift mask.

Second structure elements are formed by trenches with closely adjacent trench edges in the planar surface of the mask substrate with a depth, or by ridges with closely adjacent ridge edges within a surface etched with the depth into the surface of the mask substrate such that a light beam transmitted through the mask substrate within the trenches experiences a phase shift of 180+/−20° with respect to a light beam transmitted through the mask substrate on the planar surface outside the trenches. A method for forming the pattern on the phase shift mask can include providing a mask blank with a mask substrate, a semitransparent, phase-shifting layer, an absorber layer, and a photosensitive resist; exposing and developing the resist so that bright regions to be formed by the first portion and bright and dark regions to be formed by the second portion are opened in the resist; transferring of the bright regions of the first portion for forming the first structure elements and the bright and dark regions of the second portion of the pattern into the absorber layer and into the semitransparent layer, i.e., in an etching step; removing the resist and renewed application of a further resist; exposing and developing the further resist for covering openings formed by the transferred bright regions of the first portion in the absorber layer and the semitransparent layer and for opening the dark regions to be formed on the mask, or alternatively the bright regions to be formed of the second portion of the pattern in the resist; transferring the openings formed by the dark regions or by the bright regions of the second portion from the resist into the mask substrate as far as a depth representing a phase difference of 180+/−20° of the light beams passing through compared with mask regions without an absorber which have not undergone mask substrate etching, preferably in an etching step, for the formation of the second structure elements, the second structure elements being formed either as ridge (mesa) in the case of the transferred bright regions or as trench in the case of the transferred dark regions with in each case closely adjacent ridge or trench walls; removing the further resist; and removing the absorber layer in order to uncover the semitransparent, elevated ridges of the first structure elements.

The pattern of the phase mask can include first portions formed using halftone phase mask technology and second portions fabricated using CPL technology. The closely adjacent trench or ridge walls formed in accordance with the CPL technology are, for example, formed as structure elements in those regions of a circuit layout on the photomask in which dense arrangements of fine structure elements are necessary, if appropriate, for isolated or semi-isolated fine structures. Structures of larger width are, for instance, formed using halftone phase mask technology.

In principle, it is also possible to form isolated or semi-isolated fine structures using this technology.

While the trenches thus represent a depression within the transparent mask substrate surrounding them, the semitransparent structure elements are formed in accordance with the halftone phase mask technology as elevated structures with a limited light transmissivity made from semitransparent material on the surface of the otherwise transparent mask substrate.

In the case of the semitransparent structure elements, the patterning in the resist on a semiconductor wafer is effected on the basis of the light-shading effect of the semitransparent material. This material may be molybdenum silicide, for example. Typical values of the transmission are 6%; other values in the range below 10% but also beyond that applicable to the HT-HTPSM (high transmission halftone phase shift mask) with transmissions of up to 30%, may equally be used on a mask according to the invention. A chrome thinned as far as light transmissivity or a novel material such as TaHF can also be used according to the invention. The light transmissivity and also the phase-shifting property of the semitransparent material are characteristic. An interaction between the semitransparency of a first material and the phase-shifting property of a further phase-shifting material arranged relatively precisely in the region of the relevant structure element is included here.

With these properties, semitransparency and phase shift, isolated or semi-isolated structures can be imaged from a mask onto a wafer. Where the halftone phase mask technology exhibits weak points, i.e., in the region of dense structures with structure elements whose width lies in the region of the resolution limit of an exposure apparatus for projection onto a wafer, these elements, in accordance with a configuration according to the invention, e.g., need not be embodied in the form of semitransparent, elevated structure elements, but rather as chromeless structure elements.

Since the chromeless structure elements are present as trenches, the trench interior and the surface of the mask substrate surrounding the trenches are characterized by essentially complete transparency. The depth of the trenches, however, is such that a destructive interference of the transmitted light in the region of the trench edges takes place on account of a phase shift of 180° with an uncertainty of 20%, for example. Through sufficiently narrowed trenches, two opposite trench edges can be arranged relatively close together that their light-shading effect can be utilized for forming a long, narrow line. The second structure elements representing the trenches are, therefore, used in those portions of the pattern in which relatively small structure widths are present in conjunction with high integrity (density).

Relatively identical conditions for the formation of process windows are created for both pattern portions, those with isolated or semi-isolated structure elements and those with dense, periodic and very narrow structure elements. As a result of the corresponding formation in the form of semitransparent and trenchlike structure elements, there is an enlargement of the common process window in a common exposure.

The presence of further, totally opaque structure elements is not absolutely necessary according to the invention, but shall not be precluded here either. Moreover, the formation of SRAF auxiliary structures both in the region of the semitransparent structure elements and to assist the trenchlike structure elements is likewise provided in accordance with a particular configuration.

Further configurations envisage a width of the trenchlike second structure elements in the region of 90 nm, 70 nm, or 60 nm nodes (technology generations in which the specified width is the minimum feature size that can be achieved) since, with the use thereof instead of, for example, semitransparent structure elements or crosswalklike structure elements in accordance with the prior art, the imaging has a significantly lower to negligible mask error enhancement factor (MEEF). As a result, the uniformity of the imaging and the quality of the fabrication of integrated circuits can rise.

BRIEF DESCRIPTION OF THE FIGURES

The invention will be explained in more detail on the basis of an exemplary embodiment with the aid of a drawing, in which.

DETAILED DESCRIPTION

Figure 5A:
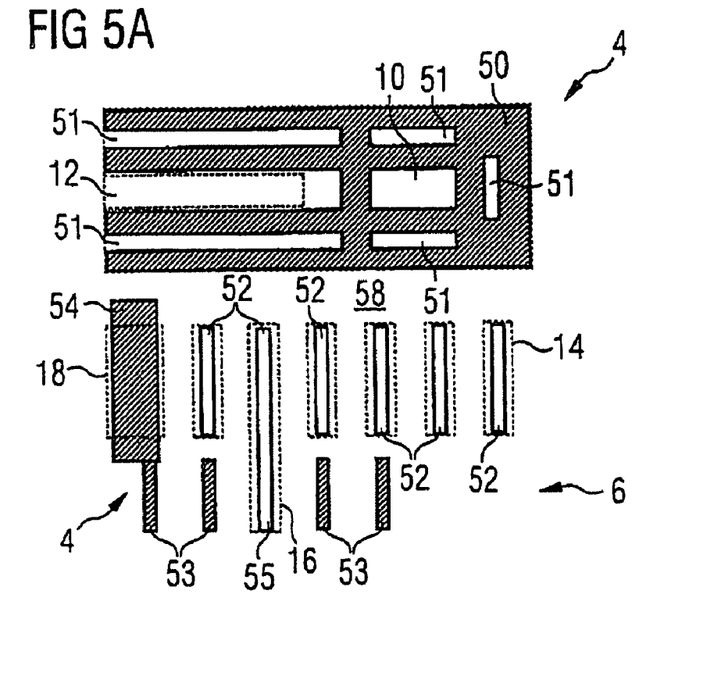
FIGS. 5A and 5B show two exemplary embodiments according to the invention in each case of a pattern on a phase mask, which are used for forming the pattern on the wafer as shown in FIG. 1, with semitransparent first structure elements and trench or mesalike, absorber-free second structure elements.
Figure 5B:
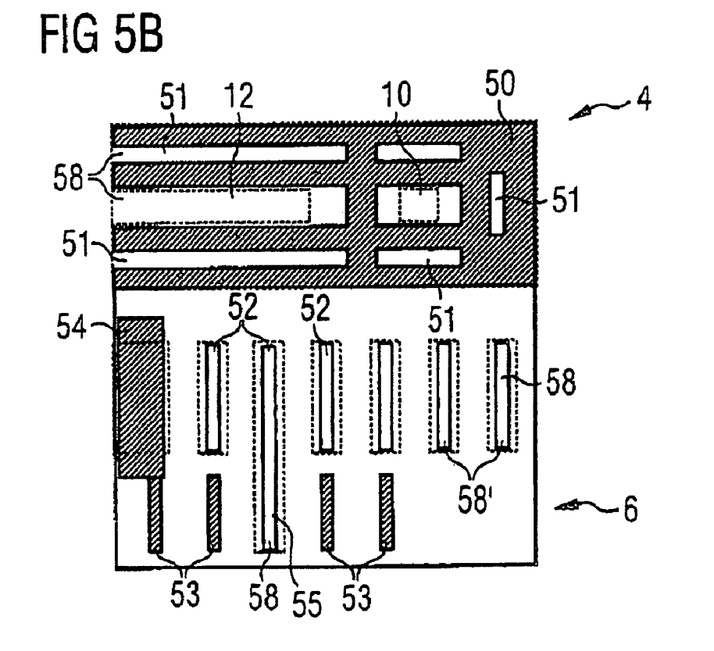

FIGS. 5A and 5B show exemplary embodiments of the present invention. In a manner similar to the examples in accordance with the prior art as shown in FIGS. 2 to 4, the exemplary embodiments of a pattern to be formed on a photomask according to the invention, as shown in FIGS. 5A and 5B, can form the pattern shown in FIG. 1 on a wafer in a lithographic projection step.

The pattern has a number of first structure elements 50, 53, 54, formed within a semitransparent layer, on a fully transparent mask substrate 58 or on the planar surface thereof. Through openings within the extended semitransparent structure element 50, bright regions of a first portion of the pattern are defined, which form the contact hole openings 10 to be formed on the wafer, or semi-isolated gaps 12 (cf. FIG. 1) in the case of an exposure. The dashed lines indicate the result on the wafer. SRAF auxiliary structures 51 formed as gaps are provided in order to assist the optical imaging properties.

Dark structures in the bright environment are formed by semitransparent structure elements 54. Semitransparent or opaque auxiliary structure elements 53 are provided to assist the imaging properties of a dense array of narrow structure elements, which is described below and is periodic in the exemplary embodiments. The elements assist the optical imaging properties of a semi-isolated structure element 55 whose process window is adapted to that of the periodically arranged structure elements 52 that are likewise to be imaged.

In the example shown in FIG. 5A (hereinafter, "trench variant"), the structure elements 52, 55 are formed as trenches surrounded by the planar surface of the mask substrate 58. The mask substrate 58 may be, for example, quartz or else CaF. Further materials known to a person skilled in the art are also possible.

In the example shown in FIG. 5B (hereinafter, "mesa variant"), the structure elements 52, 55 are analogously formed as ridges surrounded by the mask substrate surface 58' etched in as far as a depth. The surface of the ridges corresponds to the original, unetched surface of the mask substrate 58.

The trenches of the structure elements 52, 55 (FIG. 5A) and the etched-in substrate 58' (FIG. 5B) have a depth depending on the exposure wavelength and the optical properties of the mask substrate material, such that a correspondingly incident light beam within the trenches experiences a phase rotation of approximately 180° in comparison with a light beam transmitted through the adjoining surface of the mask substrate 58. Destructive interference is thereby achieved at the trench and ridge edges. The trench edges are, therefore, imaged as lines with a predetermined width in the resist on the wafer. The trenches of the structure elements 52, 55 themselves have a width such that the lines formed in the resist on the wafer in the case of a projection merge with one another as an image of the opposite trench edges.

A condition for this destructive interference is the proximity of two trench walls below the resolution limit of the imaging system, in which case unetched mask substrate (mesa variant) or etched mask substrate (trench variant) may be present between the etched trench walls.

A method for fabricating the arrangement of structure elements in a pattern 1, as shown in FIGS. 5A and 5B, provides for the narrowest structure elements 14, 16 and/or dense, periodic arrangements of structure elements 14 to be selected, for example, from the layout as shown in FIG. 1, of the structures to be formed on the wafer. For example, it is possible to specify a maximum limit value for a structure width or a lattice constant. Structure elements having widths smaller than the limit value are selected. The selected elements are assigned the property of being formed during the fabrication of the photomask in the context of a quartz etching step. The other structure elements 18, 8 of the layout of the pattern 1 to be formed on the wafer are provided with the property of being formed during the mask fabrication in the context of the opening of a layer made from semitransparent material.

The semitransparent material is, for example, molybdenum silicide or an equivalent material. The thickness of this layer is, for instance, configured to apply incident light with a phase deviation of 180° given an uncertainty of at most 20° with respect to a light beam transmitted through the surrounding, unetched mask substrate 58.

The actual mask fabrication is, for instance, effected by a first mask lithography step with an etching of absorbent material, for example, chrome, arranged on a molybdenum silicide layer, with electron lithography. Of course, optical mask lithography with deep UV or other modern techniques for mask exposure are not ruled out.

Figure 7A:
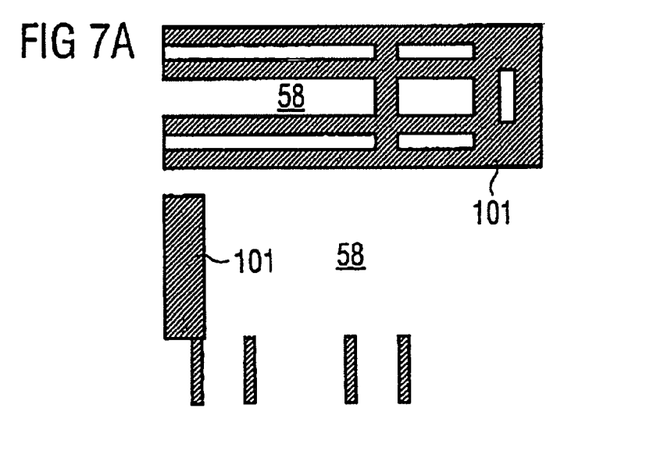
FIGS. 7A-7C show an exemplary embodiment according to the invention using trench technology and the sequence of the fabrication of the pattern according to FIG. 5A on the mask.
Figure 7B:
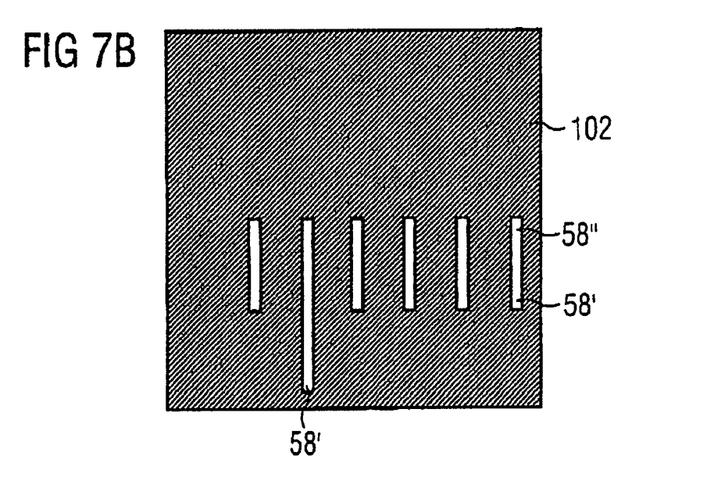
Figure 7C:
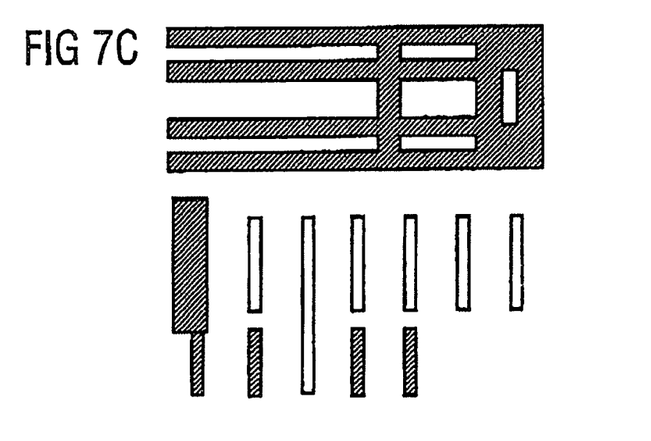
Figure 8A:
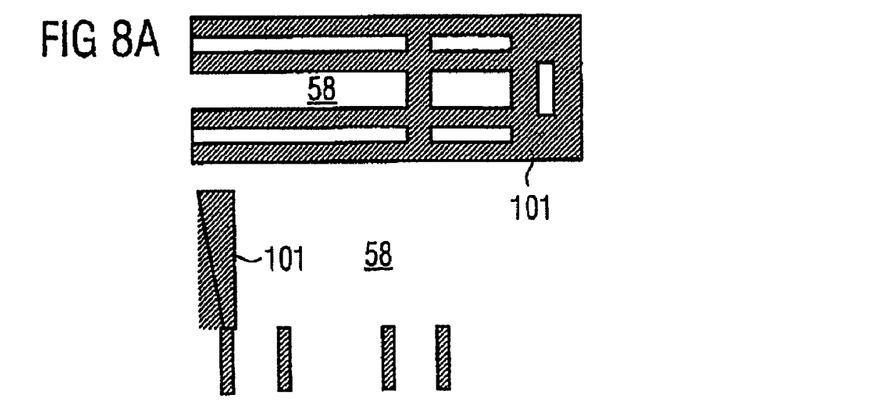
FIGS. 8A-8C show an exemplary embodiment according to the invention using mesa technology and the sequence of the fabrication of the pattern according to FIG. 5B on the mask.
Figure 8B:
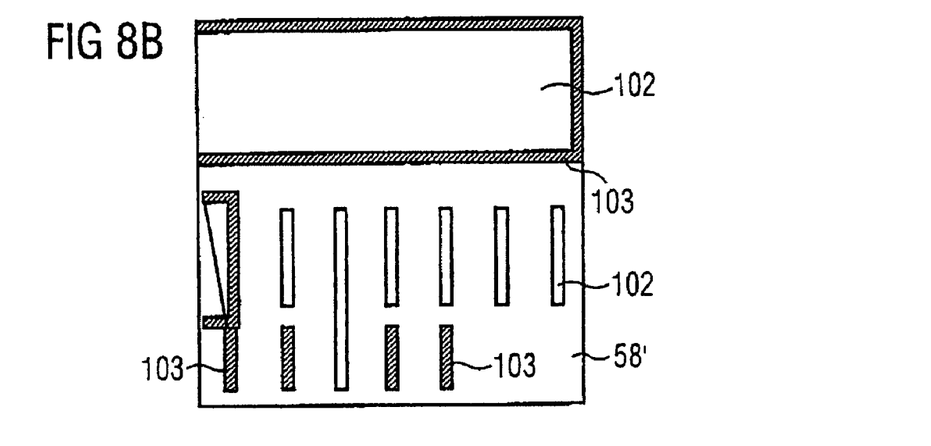
Figure 8C:
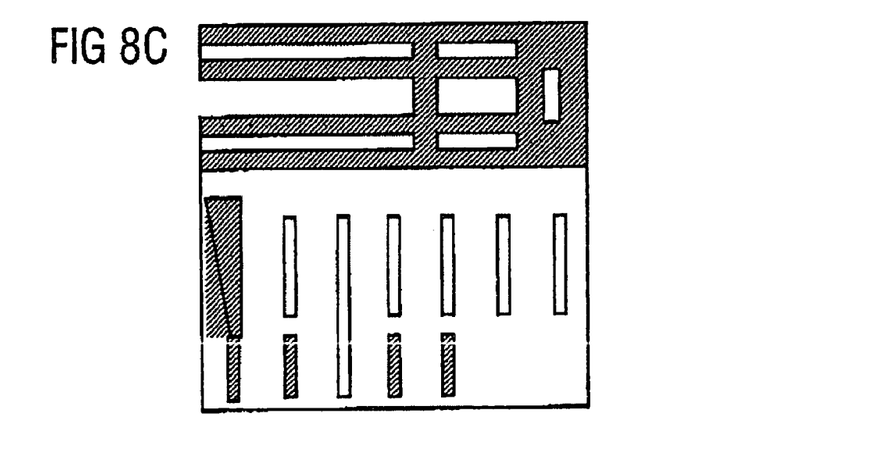

FIG. 7 shows a sequence of steps for fabricating the pattern shown in FIG. 5A, and FIG. 8 shows a sequence of steps for fabricating the pattern shown in FIG. 5B.

Firstly, a resist arranged on both layers (Cr and MoSi) is irradiated in a mask writer. The irradiated and developed structures are transferred into the chrome and molybdenum silicide layer in an anisotropic etching step. The extent of the irradiated areas etched as far as the mask substrate 58 corresponds to areas depicted light in FIGS. 7a and 8A. Residual resist structures 101 including the absorber structures concealed underneath are depicted dark.

The second mask lithography step is carried out, in which the openings of the 180° regions to be etched in the quartz of the mask substrate 58 are uncovered. These areas correspond in FIGS. 7B and 8B to the regions not occupied by the further resist 102 or absorbent etching-resistant layer 103. An accordingly irradiated resist is developed and used as an etching mask for the quartz etching step into the mask substrate 58. The etching depth is selected depending on the light wavelength of the exposure apparatus provided for the projection on the wafer.

FIGS. 7C and 8C correspond to FIGS. 5A and 5B, respectively.

Together with the structure elements 52, 55 or the trenches etched into the quartz substrate 58, RIM structures or phase assist structures may be formed in a manner directly adjoining the semitransparent structure elements 50, 54 or situated therein. In other words, no additional extra outlay is required through the common etching with the structure elements 52. The resist applied for the second mask lithography step is then removed and the absorber (chrome layer) still present on the semitransparent material or the molybdenum silicide layer can then be removed. The regions defined by the first mask lithography step are now present as elevated, semitransparent structure elements 50, 54, and the regions defined in the second mask lithography step are now present as transparent, phase-shifting trenches, which form the structure elements 52, 55, either as trench (FIG. 5A) or as mesa (FIG. 5B).

An exemplary application of the patterns illustrated diagrammatically in FIGS. 1 and 5 relates to a word line plane (gate conductor level) in a dynamic memory chip. The circuit plane has a number of long conductor tracks arranged parallel, the word lines, which are provided with peripheral connecting lines, e.g., pads, at the edge of the relevant cell array of the memory chip. The word lines have a structure width of 90 nm. The pads and the connecting lines for making contact with the pads have widths of far more than 100 nm. A 10% tolerance budget for the structure width (critical dimension) is prescribed for the imaging. Mask errors are assumed to be +/−10 nm on a mask which is imaged with four-fold demagnification.

Based on the periodicity thereof or alternatively, based on the relatively small structure width, the word lines of the memory cell array are selected in order to provide trenches in the surface of the mask substrate 58 for their formation on the photomask as structure elements 52, 55. The remaining structure elements on the mask, which serve for forming the support and peripheral structures including the pads, are formed as semitransparent structure elements 50, 54.

Figure 6:
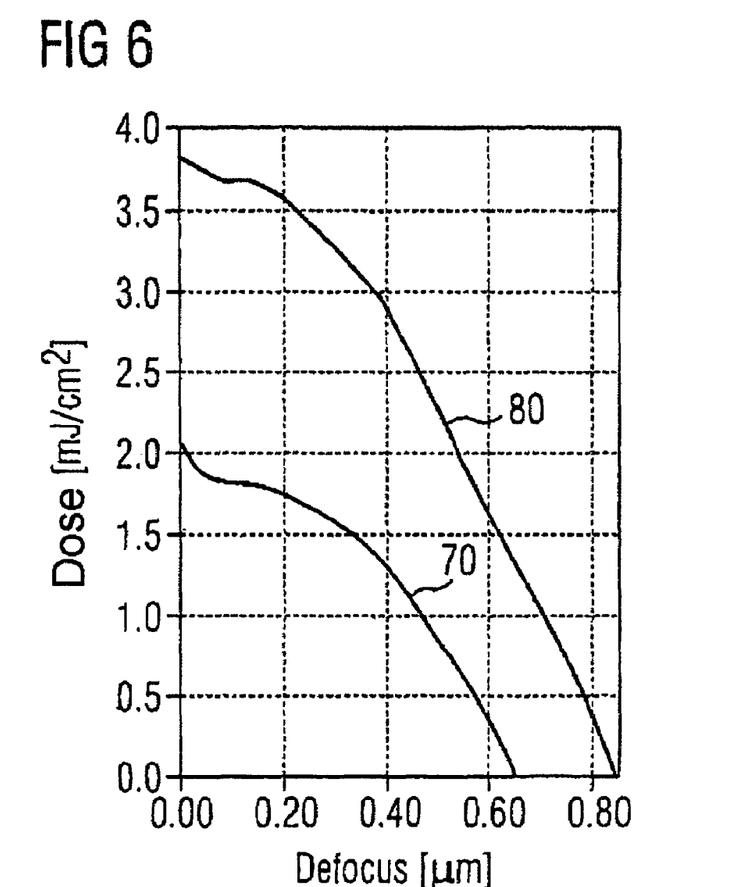
FIG. 6 shows a diagram with a comparison of the process windows in an imaging with the phase mask according to the invention (curve 80) according to FIG. 5 and with the halftone phase mask (curve 70) according to FIG. 2.

FIG. 6 illustrates the result of a simulation of the projection with the corresponding photomask on a wafer with regard to the dose margin as a function of the defocus (process window). Curve 80 shows that a 5% dose margin, corresponding to an objective quality criterion for the imaging given 0.4 µm depth of field (defocus), is almost achieved. Reducing the mask error (uniformity of the structure widths on the mask) is expected to give even better results, in particular, for example, achieving the above-mentioned quality criterion.

Curve 70 shows a result with regard to the process window achieved with halftone phase mask technology (analogously to FIG. 2). The process window is evidently considerably reduced in this example in accordance with the prior art (FIG. 2). A satisfactory imaging under the above-mentioned conditions can scarcely be achieved for the 90 nm nodes for the word line plane with the means of the prior art.

Further applications of the phase shift mask according to the invention relate, in the case of dynamic memory chips as integrated circuits, to the planes for forming active areas in the memory cell array, which, in contrast to the periphery, are formed using CPL technology. The application becomes particularly advantageous here because the memory cell array and the peripheral region are not connected to one another in this plane.

A further example relates to the bottommost metallization plane (bit lines), which are embodied in the region of the memory cell array once again using CPL technology, the tracks running from the cell array into the support or peripheral region on the mask requiring a transition from a trenchlike structure element 52 to an elevated, semitransparent structure element 54.

Isolated or semi-isolated, on the other hand very thin conductor tracks often occur in the area of application of logic circuits. Here the selection is not according to the periodicity but exclusively according to the structure width, the very thin conductor tracks being formed as trenchlike structure elements 52, while the remainder are embodied as semitransparent structure elements 54.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Pattern
8-18 structure elements in the circuit layout or to be formed on the wafer
19 Substrate
20-27 Structure elements of a pattern on mask using halftone phase mask technology
28 Transparent mask substrate
30, 37, 38 Opaque structure elements
32, 33, 381 Structure elements using RIM technology (trenches)
34, 382 Structure elements using CPL technology (trenches)
37 SRAF auxiliary structures
39 Transparent mask substrate
40, 44, 46 Opaque structure elements partly using strip technology
43, 45, 42 Structure elements using RIM and strip technology
48 Transparent mask substrate
50, 54, 53 Semitransparent structure elements (according to the invention)
52, 55 Trenchlike structure elements (according to the invention)
51 SRAF auxiliary structures as gaps in semitransparent layer
58 Fully transparent mask substrate
80 Process window curve (according to the invention)
70 Process window curve (prior art, halftone phase mask)
101 Resist (1st exposure step)
102 Further resist (2nd exposure step)
103 Further absorber layers

I claim:

1. A phase shift mask for the projection of a pattern of structure elements formed on the mask onto a substrate, the phase shift mask comprising:
a first portion of the pattern including a plurality of first structure elements formed as elevated ridges made from a semitransparent, phase-shifting material, which is arranged on a planar surface of a transparent mask substrate; and
a second portion of the pattern being free of a phase shifting or semitransparent material, the second portion including a plurality of second structure elements formed by trenches with closely adjacent trench edges in the planar surface of the mask substrate with a depth, or formed by ridges with closely adjacent ridge edges within a surface etched with the depth into the surface of the mask substrate, such that a light beam transmitted through the mask substrate within the trenches or ridges experiences a phase shift of 180 +/−20 degrees with respect to a light beam transmitted through the mask substrate on the planar surface outside the trenches.

2. The phase shift mask as claimed in claim 1, further comprising:
further structure elements formed by trenches, the further structure elements adjoining the first structure elements at least in part directly as RIM structures.

3. The phase shift mask as claimed in claim 1, wherein the second structure elements formed by trenches are surrounded by a planar surface not covered by material.

4. The phase shift mask as claimed in claim 1, wherein the second structure elements formed by adjacent trench or ridge walls have a width less than or equal to a predetermined limit value.

5. The phase shift mask as claimed in claim 4, wherein the limit value relative to the wafer scale is 90 nanometers.

6. The phase shift mask as claimed in claim 4, wherein the limit value relative to the wafer scale is 70 nanometers.

7. The phase shift mask as claimed in claim 4, wherein the limit value relative to the wafer scale is 60 nanometers.

8. The phase shift mask as claimed in claim 1, wherein the first structure elements formed by semitransparent, phase-shifting material have a width greater than a predetermined limit value.

9. The phase shift mask as claimed in claim 1, wherein the pattern represents a circuit plane of a memory chip with a cell array;
the first portion has structure elements arranged in the support or peripheral region outside the cell array, and
the second portion has structure elements arranged within the cell array.

10. The phase shift mask as claimed in claim 1, wherein the substrate is a semiconductor wafer.

11. A method for forming the pattern on the phase shift mask, comprising:
providing a mask blank with a mask substrate, a semitransparent, phase-shifting layer, an absorber layer, and a photosensitive resist;
exposing and developing the resist so that bright regions to be formed by the first portion and bright and dark regions to be formed by the second portion are opened in the resist, the second portion being free of a phase shifting or semitransparent material;
transferring the bright regions of the first portion for forming the first structure elements and the bright and dark regions of the second portion of the pattern into the absorber layer;
removing the resist and renewed application of a second resist;
exposing and developing the second resist for covering openings formed by the transferred bright regions of the first portion in the absorber layer and the semitransparent layer and for opening the dark regions to be formed on the mask, or the bright regions to be formed on the mask of the second portion of the pattern in the resist;
transferring the openings formed by the dark regions or by the bright regions of the second portion from the resist into the mask substrate as far as a depth representing a phase difference of 180 +/−20 of the light beams passing through compared with mask regions without an absorber which have not undergone mask substrate etching for the formation of the second structure elements, the second structure elements being formed as ridge (mesa) in the case of the transferred bright regions, or as trench in the case of the transferred dark regions with adjacent ridge or trench walls;
removing the further resist; and removing the absorber layer to uncover the semitransparent, elevated ridges of the first structure elements.

12. The method as claimed in claim 10, wherein the transferring the bright regions includes etching and the transferring the openings includes etching.

13. The method as claimed in claim 12, wherein the etching is performed anisotropically.

14. The method as claimed in claim 13, wherein in the first and second patterns with which a resist is respectively exposed onto the phase shift mask, none of the first structure elements directly adjoins one of the second structure elements.

* * * * *